United States Patent [19]
Ransom et al.

[11] Patent Number: 4,590,393
[45] Date of Patent: May 20, 1986

[54] HIGH DENSITY GALLIUM ARSENIDE SOURCE DRIVEN LOGIC CIRCUIT

[75] Inventors: Stephen A. Ransom, Huntingdon Valley; Tedd K. Stickel, Chalfont, both of Pa.

[73] Assignee: Sperry Corporation, Blue Bell, Pa.

[21] Appl. No.: 503,944

[22] Filed: Jun. 13, 1983

[51] Int. Cl.[4] .................... H03K 19/21; H03K 19/094
[52] U.S. Cl. ..................................... 307/471; 307/448
[58] Field of Search .............. 307/264, 448, 450, 468, 307/471, 475, 571, 582

[56] References Cited

U.S. PATENT DOCUMENTS

| | | | |
|---|---|---|---|
| 3,443,122 | 5/1969 | Bowers, Jr. | 307/571 |
| 3,500,062 | 3/1970 | Annis | 307/471 |
| 3,569,729 | 3/1971 | Washizuka et al. | 307/448 |
| 4,233,524 | 11/1980 | Burdick | 307/471 |

*Primary Examiner*—John Zazworsky
*Attorney, Agent, or Firm*—John B. Sowell; Marshall M. Truex; Thomas J. Scott

[57] ABSTRACT

A novel high speed gallium arsenide depletion mode field effect transistor logic circuit is provided. One logic input is connected to the source electrode of the switching transistor and draws current when a low level input voltage is provided. Other logic inputs are connected to the gate electrode of the switching transistor and supplies current when a high or low level input voltage is provided. The novel logic output from the source electrode of the switching transistor is a complex OR function which may be employed for a logic family having fewer stages of logic than prior art gallium arsenide circuits.

7 Claims, 12 Drawing Figures

4,590,393

HIGH DENSITY GALLIUM ARSENIDE SOURCE DRIVEN LOGIC CIRCUIT

This invention is related to our application Ser. No. 264,898 filed May 18, 1981 for a "High Gain Stabilized Converter".

BACKGROUND OF THE INVENTION

1. Field of the Invention

This invention relates to gallium arsenide (GaAs) very large scale integrated circuitry (VLSI). More particularly, this invention relates to depletion mode GaAs circuitry which is implemented in Schottky diode field effect transistor logic (SDFL).

2. Description of the Prior Art

A basic prior art GaAs inverter is shown and described in our above referenced co-pending application. The inverter shown was used to explain the problem of converting ECL signals to levels which could be employed with GaAs Schottky diode FET logic. The prior art inverter may be described as employing diode logic and gate driven transistor logic. Such prior art inverters are useful for inverting GaAs logic signals and may be employed in conjunction with the present invention.

Presently, GaAs logic may be divided into either enhancement mode or depletion mode technologies. Enhancement mode technology is adaptable to making very large scale integrated circuits (VLSI), but presents problems in the manufacture of the circuits. No enhancement mode GaAs logic circuits are yet commercially available. Enhancement mode logic is known to be a simple form of logic, but requires very difficult and precise processing in manufacturing of circuits of complexity greater than 50 to 100 gates.

This invention is concerned with depletion mode technology and more specifically with Schottky diode field effect transistor logic (SDFL). SDFL logic is functionally versatile, requires low power and is very fast and may be implemented in very large scale integrated circuits. Heretofore, SDFL logic was predominately based on diode logic and driving the gates of switching transistors.

It would be desirable to provide an improved GaAs depletion mode logic circuit that is completely compatible with prior art diode logic and gate driven logic but provides much higher density and requires fewer logic levels to perform the same prior art logic functions. By reducing the number of devices, the reliability of logic is increased, the manufacturing costs are decreased, speed is increased and less power is consumed to perform the same logic functions.

SUMMARY OF THE INVENTION

It is a primary object of the present invention to provide a novel source driven logic circuit for implementation as SDFL GaAs integrated circuits.

It is another primary object of the present invention to provide a novel GaAs source driven logic circuit which accepts standard GaAs SDFL voltage levels as input signals and produces standard GaAs SDFL voltage level signals at the output.

It is another primary object of the present invention to provide a novel source driven logic circuit which can provide non-inverting logic functions with a single stage of logic.

It is another object of the present invention to provide a new GaAs logic circuit which combines GaAs diode logic with source driven GaAs switching transistor logic.

It is yet another object of the present invention to provide a novel source driven logic circuit which enables the manufacture of higher density GaAs logic.

It is yet another object of the present invention to provide a novel source driven logic circuit which requires fewer devices for accomplishing the equivalent logic function performed by prior art logic circuits.

It is another object of the present invention to provide a novel source driven GaAs logic circuit which has fewer logic levels, is faster and requires less power than prior art logic circuits.

According to these and other objects of the present invention, there is provided a high speed GaAs source driven logic circuit which comprises an input switch transistor having a source, drain and gate electrode. A non-inverting input line is coupled to the source electrode and at least one inverting input line is coupled to the gate electrode. The output line is coupled to the drain electrode. The input switch transistor logically combines the signals on the input lines to provide a logic function output on the output line which is an OR function of the inverting and non-inverting inputs.

DESCRIPTION OF THE PREFERRED EMBODIMENTS

Figure 1:
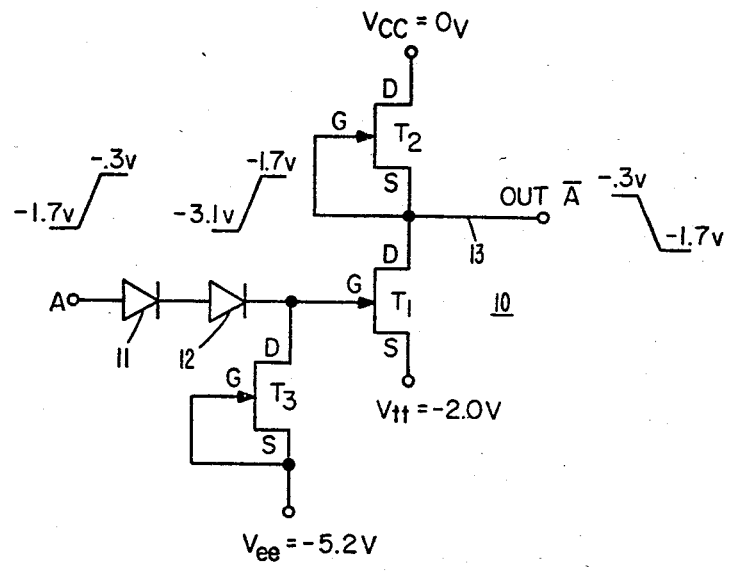
FIG. 1 is a schematic diagram showing a prior art type GaAs SDFL logic inverter.

Refer now to FIG. 1 showing a prior art type GaAs depletion mode inverter 10. When a low level or high level signal is applied to the input line at point A, the voltage level is shifted down by 0.7 volts for each of the diodes 11 and 12. Thus, the input voltage levels of −1.7 volts and −0.3 volts are shifted down to −3.1 volts and −1.7 volts when applied to the gate of switching transistor T1. When the high logic level of −1.7 volts is applied to the gate of switching transistor T1, the output at the output line 13 and drain of transistor T1 is at the logic level −1.7 volts. When the logic level of −3.1 volts is applied to the gate of switching transistor T1, the output on output line 13 is at the logic level −0.3 volts. Current source pull-up transistor T2 is connected to a positive supply voltage Vcc which is preferably at zero volts. The current source pull-down transistor T3 is shown connected to power supply voltage Vee which is preferably −5.2 volts and comprises with diodes 11 and 12 the level shifting network. The second power supply voltage Vtt is preferably equal to −2.0 volts and is connected to the source of the switching transistor T1. The terminologies for the power supply voltages are chosen to be compatible with terminology employed in emitter couple logic (ECL).

The power supply voltage levels shown in FIG. 1 are levels that are selected to be compatible with ECL logic and may be changed as long as the relative values are maintained. Thus, when the low level input signal of −1.7 volts is applied at input line A, it appears at the output line 13 as an inverted signal at −0.3 volts. Similarly, the high level voltage signal of −0.3 volts applied to input line A is inverted and appears at the output at −1.7 volts.

Figure 2:
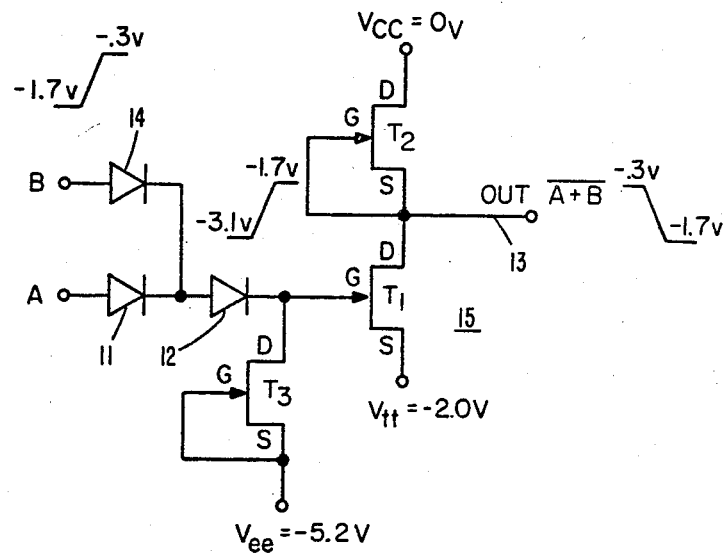
FIG. 2 is a schematic diagram showing the inverter of FIG. 1 modified to provide a prior art type diode logic and gate driven logic NOR circuit.

Refer now to NOR gate 15 of FIG. 2 which shows a modified form of the inverter 10 of FIG. 1. Two inputs A and B provide the gate driven logic NOR circuit. The transistors T1, T2 and T3 are arranged in the same circuit configuration as explained hereinbefore with reference to FIG. 1 and the same elements are numbered the same as in FIG. 1. The B input to the NOR circuit 15 has a diode 14 which is hardwire OR connected between the diodes 11 and 12 of the A input. The diodes 11, 12 and 14 perform the OR function as well as the voltage level shifting network which now comprises diodes 11, 12, 14 and pull-down transistor T3. The signal on the gate of switching transistor T1 is the same as explained hereinbefore with reference to FIG. 1. Thus, the logical inversion occurs as a result of the gate driven transistors T1 and current source pull-up transistor T2. Any high level signal applied at the inputs A or B produces the inverted output $\overline{A+B}$ at output line 13.

Figure 3:
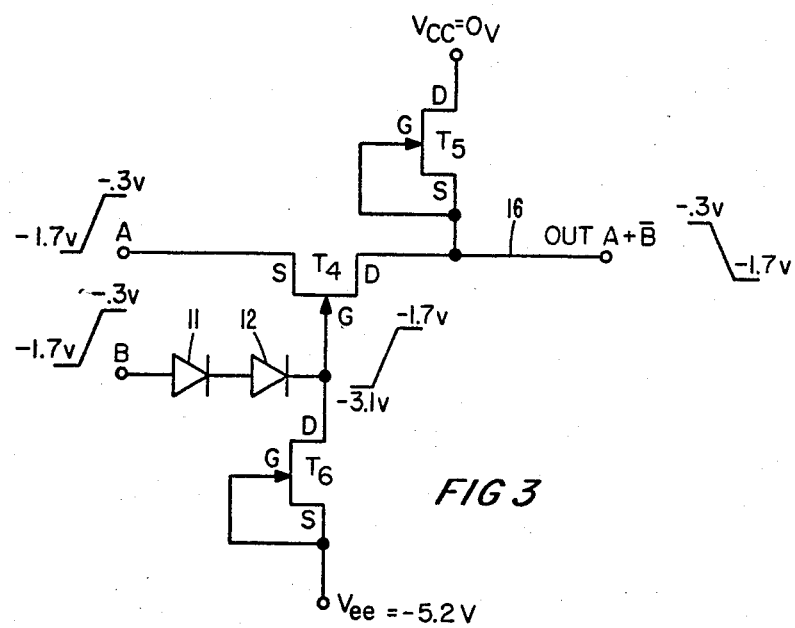
FIG. 3 is a schematic diagram showing the simplest form of the present invention source driven logic which provides the logic function A OR NOT B.

Refer now to FIG. 3 showing a simplified form of the present invention employing source driven logic. A low output is produced on output line 16 only when the low input condition is presented at input A and the high condition is presented at input B. The high voltage condition of −0.3 volts applied to input B is level shifted down to −1.7 volts at the gate of switching transistor T4 to cause an ON or conducting state. When the low condition of −1.7 volts is applied to input A, a condition is created that pulls current out of the current source pull-up transistor T5 to produce a low voltage output on output line 16. The current source pull-down transistor T6 performs the same function as the transistors T3 as previously described. When any other condition other than the low condition on point A or the high condition on point B is applied to the logic circuit of FIG. 3, a high output is produced on line 16. In the novel source driven logic circuit of FIG. 3, current is flowing toward input A when the output is low on output line 16. Current is always flowing from point B to the drain of transistor T6. Even though the current flow direction is changed on input A, it will be understood that all voltage inputs to lines A and B are completely compatible with Schottky diode field effect transistor logic of the type shown in prior art FIGS. 1 and 2. Further, the logic function voltages −0.3 volts and −1.7 volts shown on output line 16 are completely compatible with SDFL logic circuits and do not require further conversion.

The voltage signal which is applied to input line A appears at the output as a non-inverted signal. The voltage signal which is applied at input line B is level shifted by the level shifting network and inverted by the switching transistor T4. As will be explained hereinafter, the novel logic function A OR $\overline{B}$ on output line 16 has numerous advantages over the prior art.

Figure 4:
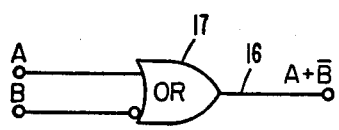
FIG. 4 is a logic symbol drawing of the logic circuit of FIG. 3.

Refer now to FIG. 4 which is a logic symbol drawing of the logic circuit of FIG. 3. The OR gate 17 is shown having a non-inverting input A and an inverting input B which produces directly the output on line 16 shown as A OR $\overline{B}$. Only one stage of logic is employed in accomplishing this logic output and the propagation delay is reduced accordingly.

Figure 5:
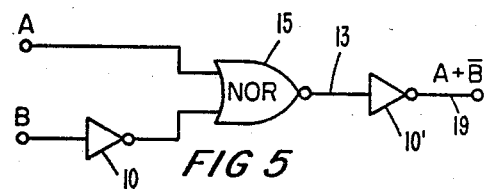
FIG. 5 is a logic symbol drawing of the implementation required using the prior art circuits of FIGS. 1 and 2 to accomplish the logic functions shown in FIGS. 3 and 4.

Refer now to FIG. 5 which is a logic symbol drawing showing the implementation which would be required using the prior art circuits of FIGS. 1 and 2 to accomplish the same logic function output shown on line 16. Since both the A and B inputs in FIG. 2 are applied to the gate of the switching transistor T1, the B input must be inverted by an inverter 10 of the type shown in FIG. 1. The OR logic function for NOR gate 15 is accomplished by the aforementioned diodes 11 and 14. The inversion function for NOR gate 15 is accomplished by the amplifier comprising transistors T1 and T2 shown in FIG. 2. The output on line 13 from NOR gate 15 must now be again inverted by an inverter 10' to produce the desired logic output of A OR $\overline{B}$.

The logic function accomplished by FIGS. 3 and 4 is simpler, faster and require much less power than the logic shown in FIG. 5 which requires two of the FIG. 1 inverter circuits and one of the FIG. 2 NOR gate circuits.

Figure 6:
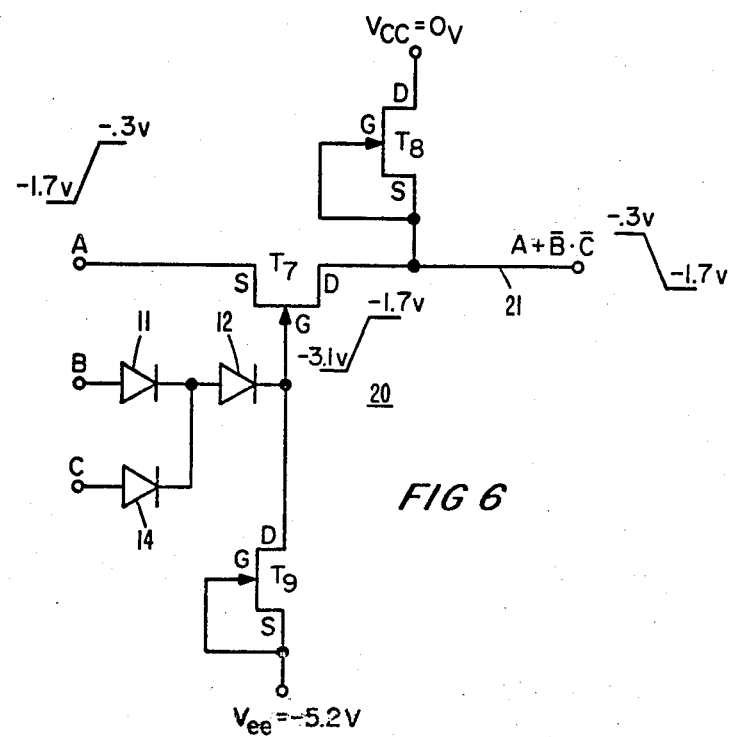
FIG. 6 is a schematic diagram showing a modified form of the present invention source driven logic which provides the logic function A OR ($\overline{B}$ AND $\overline{C}$)

Refer now to FIG. 6 and circuit 20 which is a schematic drawing of a modified form of the present invention employed to produce the logic function A OR ($\overline{B}$ AND $\overline{C}$). Two conditions are required in order to produce the desired low output on output line 21 of FIG. 6. First, the voltage level input at input A must be at the low logic level of −1.7 volts to allow the possibility of transistor T7 switching output line 21 low. Secondly, a high logic level condition of −0.3 volts must be at either or both the B OR C inputs of the input of the OR gate which comprises diodes 11, 12 and 14 in order to turn on switching transistor T7 with a high logic level voltage of −1.7 volts. When these two conditions are present, the output on output line 21 is a low level signal representative of the logic function A OR ($\overline{B}$ AND $\overline{C}$). It will be understood that when three input variables A, B and C are available, there are eight variations. The output A OR ($\overline{B}$ AND $\overline{C}$) is descriptive of all eight possible combinations of the inputs. FIG. 6 is essentially the same structure as FIG. 3 but has an additional OR input. The voltage levels at the inputs drive the transistors T7, T8 and T9 in the same manner as in FIG. 3 to produce the output on output line 21.

Figure 7:
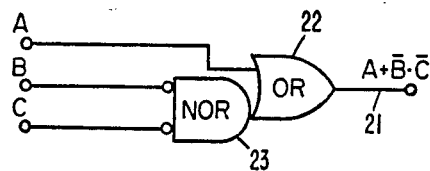
FIG. 7 is a logic symbol drawing of the logic circuit of FIG. 6.

Refer now to FIG. 7 which is a logic symbol drawing of the logic circuit of FIG. 6. FIG. 7 is designed to show the input conditions at the A, B and C inputs which will produce the logic high on the output line 21. When the A input to the OR gate portion of gate 22, 23 is high, OR both B and C inputs are low so that the NOR gate portion of gate 22, 23 produces a high on its output to OR gate 22, a high output is produced on output line 21.

Figure 8:
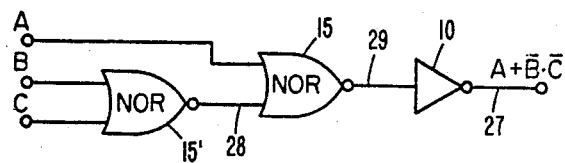
FIG. 8 is a logic symbol drawing of the implementation required using the prior art circuits of FIGS. 1 and 2 to accomplish the logic functions shown in FIGS. 6 and 7.

Refer now to FIG. 8 which is a logic symbol drawing of the implementation required using the prior art circuits of FIGS. 1 and 2 to accomplish the logic function shown in FIGS. 6 and 7. The three stages of logic in FIG. 8 are implemented with two NOR gates 15 shown in FIG. 2 and one inverter 10 shown in FIG. 1. In order to produce the high logic voltage condition on output line 27, the A input to NOR gate 15 must be in the high condition OR both the B and C inputs to the NOR gate 15' must be in the low condition to produce a high output on line 28 which is applied to the NOR gate 15 in order to produce a low output on line 29 which is inverted in inverter circuit 10 to produce the high output on output line 27.

FIG. 8 requires three stages of logic to produce the logic function shown on output line 27, whereas only one stage of logic is required to produce the same logic output shown on output line 21. It will be appreciated that the structure shown in FIG. 6 will require less real estate on a GaAs substrate than the corresponding logic function implemented with the prior art circuits shown in FIGS. 1 and 2. When there are less stages of logic, the density on the chip can be much higher and the throughput of signals is faster. Also, less power is also required to drive fewer devices. Another advantage is that only one power source is required in the FIG. 6 embodiment whereas two power sources are required to implement circuits employing the prior art FIG. 1 and FIG. 2 type circuits.

Figure 9:
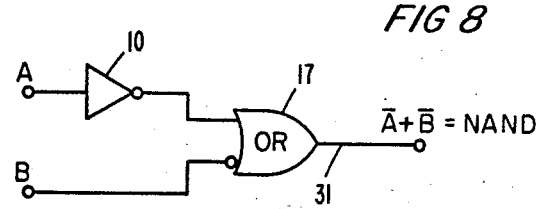
FIG. 9 is a logic symbol drawing of the logic circuit of FIG. 3 having the A input inverted to provide a NAND logic function output.

FIG. 9 is a logic symbol drawing of the logic circuit of FIG. 3 which has an inverter connected in series in the input line A to provide a logic output $\overline{A}$ AND B which by DeMorgan's rule is a NAND gate function. This logic symbol drawing also illustrates the compatibility of the present invention employing the prior art type inverter. The inverter 10 shown in series in the non-inverting input line A provides the necessary inversion for the NAND gate function. The OR gate 17 is the same OR logic as shown in FIG. 4 which is representative of the logic circuit of FIG. 3. Only when both the A and B inputs are high, the output on output line 31 will be low as occurs in any NAND gate circuit.

Figure 10:
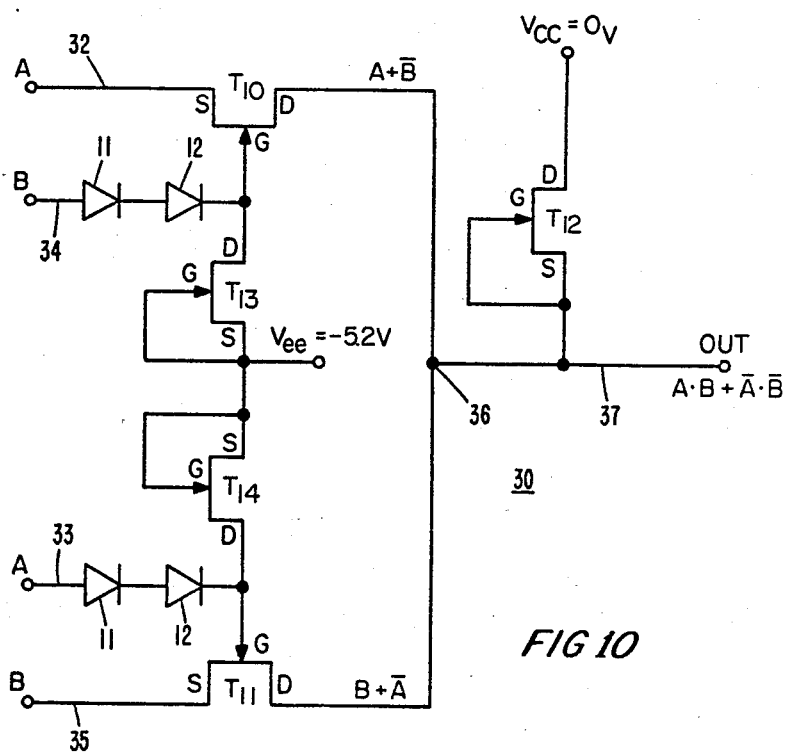
FIG. 10 is a schematic diagram showing the novel implementation of an EXCLUSIVE NOR function employing the present invention source driven logic.

Refer now to FIG. 10 which is a schematic diagram showing a further modification of the circuit of FIG. 3. The circuit 30 shown in FIG. 10, is in effect two FIG. 3 type circuits interconnected back to back to produce an EXCLUSIVE NOR logic function output. The A input on line 32 and the B input on line 34 are applied to the switching transistor T10 to produce the A OR $\overline{B}$ logic condition at node 36 when the A input is high or the B input is low. In similar manner, the B input on line 35 is applied to the source of switching transistor T11 and the A input on line 33 is now applied via the level shifting diodes 11 and 12 to the gate of switching transistor T11 to produce the B OR $\overline{A}$ logic condition at node 36. When the B input is high to the source of switching transistor T11 or the A input is low on line 33 to the gate of the switching transistor T11, the logic condition $\overline{A}$ OR B is at node 36. The second logic condition A OR $\overline{B}$ is also hardwired to the node 36 which produces a hardwired AND function. The two inputs yield the desired EXCLUSIVE NOR function A AND B OR $\overline{A}$ AND $\overline{B}$ on output line 37. The current source pull-up transistor T12 and the two current source pull-down transistors T13 and T14 operate in the same manner as described hereinbefore with reference to transistors T5 and T6 in FIG. 3.

Figure 11:
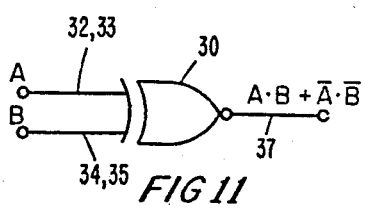
FIG. 11 is a logic symbol drawing showing the EXCLUSIVE NOR logic function of the novel logic circuit of FIG. 10.

Refer now to FIG. 11 which is a logic symbol drawing showing the function of the logic circuitry of FIG. 10. The EXCLUSIVE NOR gate 30 has two A inputs from lines 32 and 33 and two B inputs from lines 34 and 35. The result of the EXCLUSIVE NOR function is shown on output line 37 and only requires one stage of logic throughput to accomplish the desirable novel EXCLUSIVE NOR output.

Figure 12:
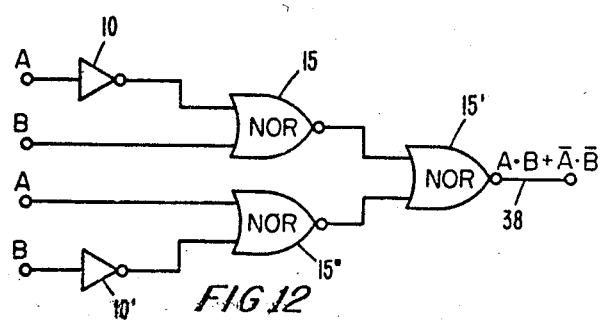
FIG. 12 is a logic symbol drawing showing the implementation required using the prior art circuits of FIGS. 1 and 2 to accomplish the logic functions shown in FIGS. 10 and 11.

Refer now to FIG. 12 which is a logic symbol drawing showing the implementation required using the prior art circuits of FIGS. 1 and 2 to accomplish the same logic function shown in FIGS. 10 and 11. The first A input is inverted at inverter 10 and applied to the first NOR gate 15 shown in FIG. 2. The first B input is applied directly to the first NOR gate 15. The output of NOR gate 15 is applied to a second NOR gate 15' to produce the desired output on output line 38. The second A input is applied directly to the third NOR gate 15''. The second B input to the third NOR gate 15'' is inverted at the second inverter 10'. The output from the third NOR gate 15'' is applied to the input of the second NOR gate 15' to produce the desired EXCLUSIVE NOR output on line 38. Five stages of logic and three logic delays are employed in the prior art type implementation shown in FIG. 12. Not only are a greater number of stages required, but a larger number of devices are employed. Further, more power, more power supplies and more real estate is required to implement the prior art logic.

Having explained a simplified novel source driven logic OR circuit 10 for implementation as Schottky diode field effect transistors employing GaAs substrate integrated circuits, and three modifications of the novel source driven circuit 10, it will be understood that simplified depletion mode GaAs circuits may now be manufactured as very large scale integrated circuits having high density. The present invention, simplified source driven logic circuits, provides means for manufacturing GaAs logic which has high speed and low power requirements in a simplified circuit environment which assures high yields.

It is possible to employ prior art SDFL circuit logic in conjunction with the present source driven logic family without change or degradation of performance of either the input or output signals of the present invention or the SDFL logic. The present source driven logic family may be combined with known diode gating logic to produce additional desired variation of the logic shown and described in this application.

We claim:

1. A high density GaAs source driven logic circuit comprising:
   input switch transistor means having source, drain and gate electrodes,
   at least one non-inverting input line coupled to said source electrode, at least one inverting input line coupled to said gate electrode, an output line coupled to said drain electrode, current source pull-down transistor means coupled to said output line, and current source pull-down transistor means coupled to said gate electrode of said input switch transistor means, whereby said at least one inverting input signal on one of said inverting input lines is logically combined by said input switch transistor means with a non-inverting input signal on said non-inverting input line to provide a logic function output on said output line.

2. A high density GaAs source driven logic circuit as set forth in claim one which further includes a level shifting network, and wherein said at least one inverting input line comprises a plurality of input lines and each having a said inverting input signal thereon which is level shifted by said level shifting network.

3. A high density GaAs source driven logic circuit as set forth in claim 2 wherein the logic function output on said output line is an OR function of the inverting and non-inverting input lines, said level shifting network being coupled in series with said inverting inputs coupled to said gate electrode of said input switch transistor means to provide inverting logic inputs, a power source, said current source pull-down transistor means being further coupled between said gate electrode of said input switch transistor means and said power source, said current source pull-up transistor means being further coupled to said drain electrode of said input switch transistor means, and said output line being coupled to said source of said current source pull-up transistor means, whereby one of said plurality of said input lines is applied directly to said input switching transistor means and said plurality of inverting input lines are applied to said level shifting network before being applied to the gate electrode of said input switch transistor means to provide a logic function output on said output line having input voltage inversion.

4. A high density GaAs source driven logic circuit as set forth in claim 1 wherein said at least one inverting input line comprises at least a pair of inverting input lines, said at least one non-inverting input line comprises at least a pair of non-inverting input lines, said current source pull-down transistor means comprises at least a pair of transistors, and said logic function output on said output line comprises an EXCLUSIVE NOR output.

5. A high density GaAs source driven logic circuit as set forth in claim 1 wherein the input signals on said non-inverting and said inverting input lines comprises two predetermined logic voltage levels on said input lines and said input switch transistor means provides said predetermined voltage logic levels on said output line.

6. A high density GaAs source driven logic circuit as set forth in claim 5 wherein said input signals are logically combined in said input switch transistor means to provide a non-inverting logic function output on said output line having the same logic levels as said input signals.

7. A high density GaAs source driven logic circuit comprising:

a pair of input switch transistors having source, drain and gate electrodes, a pair of logic inputs, one of said pair of said logic inputs being coupled to said source electrode of one of said pair of input switch transistors and to the gate electrode of the other input switch transistor, the other one of pair of said logic inputs being coupled to said gate electrode of said one of said pair of input switch transistors and to the source electrode of said other input switch transistor, a level shifting network respectively coupled in series with each one of said pair of said logic inputs that is coupled to said gate electrodes of said pair of input switch transistors, a power source, a pair of current source pull-down transistors coupled between said gate electrodes of said input switch transistors and said power source, a current source pull-up transistor having a source electrode coupled to said drain electrodes of said input switch transistors, and an output line coupled to said source electrode of said current source pull-up transistor, whereby an exclusive NOR logic function output is provided on said output line.

* * * * *